US010192760B2

(12) United States Patent
Lee et al.

(10) Patent No.: US 10,192,760 B2
(45) Date of Patent: Jan. 29, 2019

(54) SUBSTRATE SUPPORTING UNIT, SUBSTRATE PROCESSING APPARATUS, AND METHOD OF MANUFACTURING SUBSTRATE SUPPORTING UNIT

(71) Applicant: EUGENE TECHNOLOGY CO., LTD., Yongin-si, Gyeonggi-do (KR)

(72) Inventors: Dong-Keun Lee, Asan-si (KR); Kyung-Jin Chu, Suwon-si (KR); Sung-Tae Je, Gumi-si (KR); Il-Kwang Yang, Yongin-si (KR)

(73) Assignee: Eugene Technology Co., Ltd., Yongin-si, Gyeonggi-do (KR)

( * ) Notice: Subject to any disclaimer, the term of this patent is extended or adjusted under 35 U.S.C. 154(b) by 391 days.

(21) Appl. No.: 14/922,869

(22) Filed: Oct. 26, 2015

(65) Prior Publication Data

US 2016/0049317 A1    Feb. 18, 2016

Related U.S. Application Data

(62) Division of application No. 12/865,373, filed on Jul. 29, 2010, now abandoned.

(51) Int. Cl.
*H01L 21/67* (2006.01)
*H01L 21/687* (2006.01)

(52) U.S. Cl.
CPC .. *H01L 21/67103* (2013.01); *H01L 21/68785* (2013.01); *Y10T 29/4913* (2015.01)

(58) Field of Classification Search
CPC ......... H01L 21/67103; H01L 21/67011; Y10T 29/4913; Y10T 29/49124; Y10T 29/49117; Y10T 29/49002

USPC .................. 29/832, 829, 825, 592.1
See application file for complete search history.

(56) References Cited

U.S. PATENT DOCUMENTS 5,062,386 A * 11/1991 Christensen ........ C23C 16/4411
118/715

FOREIGN PATENT DOCUMENTS

| JP | 09-306979 A | 12/1997 |
| JP | 2000-068183 A | 3/2000 |
| JP | 2000-180071 A | 6/2000 |
| JP | 2005-229043 A | 8/2005 |
| JP | 2006-343209 A | 12/2006 |
| KR | 20010027089 A * | 4/2001 |

(Continued)

OTHER PUBLICATIONS

Search Report for International Application No. PCT/KR2009/000517.

*Primary Examiner* — Peter DungBa Vo
*Assistant Examiner* — Azm Parvez
(74) *Attorney, Agent, or Firm* — Rabin & Berdo, P.C.

(57) ABSTRACT

A substrate supporting unit, a substrate processing apparatus, and a method of manufacturing the substrate supporting unit are provided. The substrate supporting unit includes a susceptor provided with heaters to heat a substrate placed on the susceptor, and including a first temperature region and a second temperature region having a higher temperature than that of the first temperature region; a heat dissipating member including a contact surface being in thermal contact with the second temperature region; and a reflecting member disposed approximately in parallel with one surface of the susceptor to reflect heat emitted from the susceptor toward the susceptor.

3 Claims, 7 Drawing Sheets

(56) References Cited

FOREIGN PATENT DOCUMENTS

KR  10-2001-0090517 A   10/2001
KR  10-2001-0111638 A   12/2001

\* cited by examiner

SUBSTRATE SUPPORTING UNIT, SUBSTRATE PROCESSING APPARATUS, AND METHOD OF MANUFACTURING SUBSTRATE SUPPORTING UNIT

CROSS REFERENCE TO RELATED APPLICATIONS

This application is a division of U.S. patent application Ser. No. 12/865,373, filed Jul. 29, 2010, which was the National Stage of International Application No. PCT/KR2009/000517, filed Feb. 3, 2009, which claimed priority to Korean Patent Application No. 10-2008-0011231, filed Feb. 4, 2008, the disclosures of which are hereby incorporated by reference in their entireties for all purposes.

BACKGROUND OF THE INVENTION

1. Field of the Invention

The present invention relates to a substrate supporting unit, a substrate processing apparatus, and a method of manufacturing the substrate supporting unit, and more particularly to a substrate supporting unit and a substrate processing apparatus, which uniform a temperature distribution of a substrate, and a method of manufacturing the substrate supporting unit.

2. Description of Related Art

In general, a semiconductor fabrication method includes a deposition process of a wafer or an etching process of a wafer. In this process, the wafer is heated up to 500° C. to 700° C. by a resistor heater or a lamp heater under the condition that the wafer is loaded on a ceramic-made or metal-made susceptor.

In this case, in order to obtain process uniformity, a temperature distribution on the wafer needs to be uniformly adjusted, and, for this reason, the temperature of the susceptor needs to be uniformed.

BRIEF SUMMARY OF THE INVENTION

Therefore, the present invention has been made in view of the above problems, and it is an object of the present invention to provide a substrate supporting unit and a substrate processing apparatus, which uniformly adjust a temperature distribution on a wafer, and a method of manufacturing the substrate supporting unit.

It is another object of the present invention to provide a substrate supporting unit and a substrate processing apparatus, which uniformly adjust a temperature distribution on a susceptor, and a method of manufacturing the substrate supporting unit.

In accordance with an aspect of the present invention, the above and other objects can be accomplished by the provision of a substrate supporting unit comprising a susceptor provided with heaters to heat a substrate placed on the susceptor, and including a first temperature region and a second temperature region having a higher temperature than that of the first temperature region; and a heat dissipating member including a contact surface being in thermal contact with the second temperature region.

The heat dissipating member may further include an opening corresponding to the first temperature region. The heat dissipating member may be formed in a ring shape, in which the opening is surrounded with the contact surface, and the contact surface of the heat dissipating member may make thermal contact with the lower surface of the susceptor.

The opening may be surrounded with the ring-shaped contact surface, and include a first opening part formed in a fan shape having a first radius; and a second opening part formed in a fan shape having a second radius being different from the first radius. The opening may further include an intermediate opening part disposed between the first opening part and the second opening part and adjoining the first and second opening parts.

The susceptor may include a central region, an edge region, and a middle region disposed between the central region and the edge region; and the opening may be disposed corresponding to the central region, and the contact surface is disposed corresponding to the middle region.

The heaters may include a first heater to heat the central part of the substrate; and a second heater surrounding the first heater to heat the edge part of the substrate.

The heat dissipating member may be made of one selected from the group consisting of ceramic, AlN, Ni, and Inconel.

The substrate supporting unit may further comprise a reflecting member disposed approximately in parallel with one surface of the susceptor to reflect heat emitted from the susceptor toward the susceptor.

The susceptor may further include a third temperature region having a lower temperature than that of the second temperature region and a fourth temperature region having a higher temperature than that of the third temperature region; and the reflecting member may heat the third temperature region by the heat reflection.

The reflecting member may be formed in a disk shape, and include a first reflecting member part formed in a fan shape having a first radius; and a second reflecting member part formed in a fan shape having a second radius being different from the first radius.

In accordance with another aspect of the present invention, there is provided a substrate processing apparatus comprising a chamber providing an internal space, in which a substrate is processed; a substrate supporting unit provided in the chamber to support the substrate, and a shower head to supply process gas to the upper surface of the substrate supported by the substrate supporting unit, wherein the substrate supporting unit includes a susceptor provided with heaters to heat the substrate placed on the susceptor, and including a first temperature region and a second temperature region having a higher temperature than that of the first temperature region; a heat dissipating member including a contact surface being in thermal contact with the second temperature region and an opening corresponding to the first temperature region; and a reflecting member disposed approximately in parallel with one surface of the susceptor to reflect heat emitted from the susceptor toward the susceptor; and the opening is surrounded with the ring-shaped contact surface; and the opening includes a first opening part formed in a fan shape having a first radius; and a second opening part formed in a fan shape having a second radius.

In accordance with a further aspect of the present invention, there is provided a method of manufacturing a substrate supporting unit provided with a susceptor, on which a substrate is placed, comprising installing a heat dissipating member at one side of the susceptor, including a first temperature region and a second temperature region having a higher temperature than that of the first temperature region, such that the heat dissipating member is in thermal contact with the second temperature region so as to emit heat of the second temperature region.

The method may further comprise forming an opening corresponding to the first temperature region through the heat dissipating member to prevent thermal contact between the first temperature region and the heat dissipating member.

The heat dissipating member may be formed in a ring shape, in which the opening corresponding to the first temperature region is surrounded with a contact surface corresponding to the second temperature region; and the formation of the opening may include forming a first opening part in a fan shape having a first radius; and forming a second opening part in a fan shape having a second radius being different from the first radius.

The susceptor may include a central region, an edge region, and a middle region disposed between the central region and the edge region; and the installation, of the heat dissipating member may include disposing an opening corresponding to the first temperature region so, as to correspond to the central region; and disposing a contact surface being in thermal contact with the second temperature region so as to correspond to the middle region.

The method may further comprise disposing a reflecting member approximately in parallel with one surface of the susceptor to reflect heat emitted from the susceptor toward the susceptor.

The susceptor may further include a third temperature region having a lower temperature than that of the second temperature region and a fourth temperature region having a higher temperature than that of the third temperature region; and the disposition of the reflecting member may include processing the reflecting member formed in a disk shape having a predetermined radius to form a first reflecting member part in a fan shape having a first radius being smaller than the predetermined radius; and processing the reflecting member to form a second reflecting member part in a fan shape having a second radius being smaller than the predetermined radius and being different from the first radius.

BRIEF DESCRIPTION OF DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
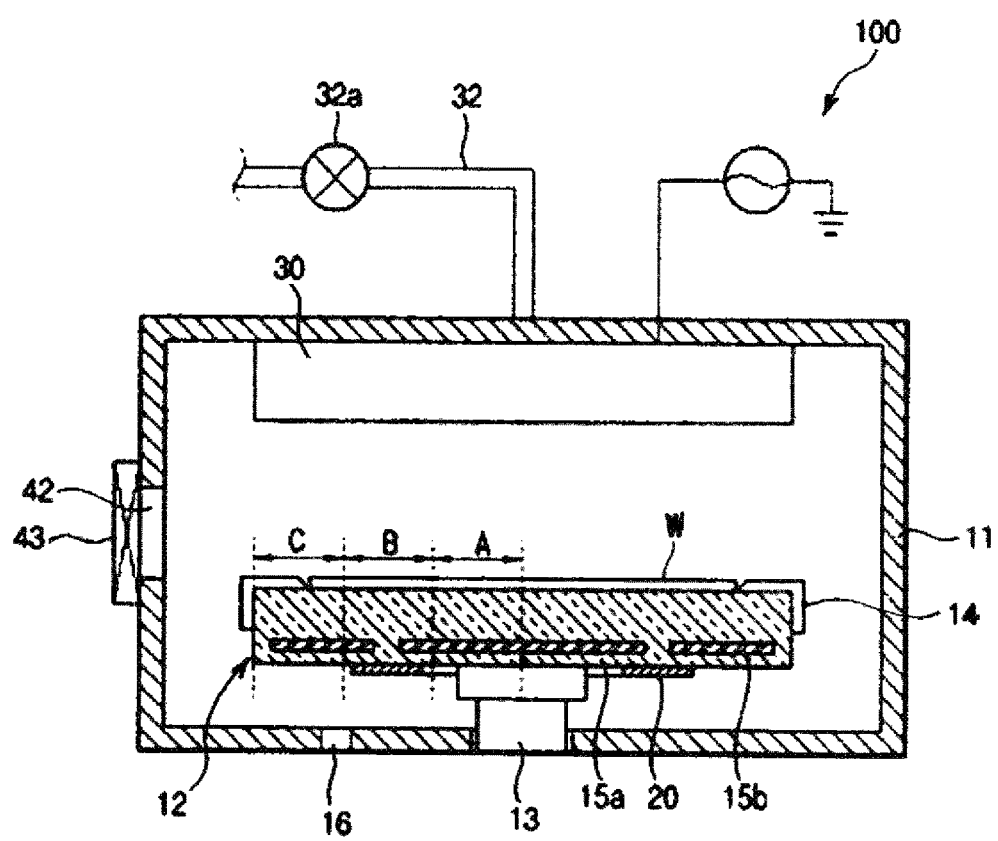
FIG. 1 is a view schematically illustrating a substrate processing apparatus in accordance with one embodiment of the present invention.

Now, preferred embodiments of the present invention will be described in detail with reference to FIGS. 1 to 7. It will be appreciated that these embodiments of the present invention can be variously modified, and the scope of the present invention is not restricted by the embodiments, which will be described below. The description of the embodiments has been made only for a better understanding of the present invention to those skilled in the art. Therefore, shapes of respective elements shown in the drawings may be exaggerated for a clearer explanation.

Although a deposition apparatus will be exemplarily described hereinafter, the present invention may be applied to various substrate processing apparatuses, each of which is provided with a substrate supporting unit. Further, although a wafer (W) will be exemplarily described hereinafter, the present invention may be applied to various objects to be processed.

FIG. 1 is a view schematically illustrating a substrate processing apparatus 100 in accordance with one embodiment of the present invention. The substrate processing apparatus 100 serves to deposit a film, and includes a chamber 11 having a cylindrical shape. A suseeptor 12 having a disk shape to horizontally support the wafer (W) is disposed in the chamber 11, and is supported by a supporting member 13. The susceptor 12 is made of ceramic, for example, $Al_2O_3$, AlN, or etc. A guide ring 14 to guide the wafer (W) is provided at the circumference of the susceptor 12.

Heaters 15a and 15b are installed within the susceptor 12. The first heater 15a mainly heats the central portion of the susceptor 12, and the second heater 15b mainly heats the edge portion of the susceptor 12. The heaters 15a and 15b include coil-type heaters or pattern heaters, and power supplies to the heaters 15a and 15b are independently carried out and thus heating temperatures of the heaters 15a and 15b are independently controlled. The wafer (W) is heated to a designated temperature by the heaters 15a and 15b. The susceptor 12 includes a thermocouple (not shown), and the thermocouple senses the temperature of the susceptor 12 to be capable of controlling the temperature of the susceptor 12.

A shower head 30 is installed at the ceiling of the chamber 11. The shower head 30 supplies process gas from a gas supply line 32 to the susceptor 12, and the gas supply line 32 is opened and closed by a valve 32a. A high frequency power source is connected to the shower head 30, and supplies designated high frequency power to the shower head 30, as occasion demands.

An exhaust port 16 is formed through the bottom of the chamber 11, and thus the process gas and residual products are exhausted to the outside of the chamber 11 through the exhaust port 16. Further, the inside of the chamber 11 may be decompressed to a designated vacuum degree through the exhaust port 16. A gate 42, through which the wafer (W) is put into and taken out of the chamber 11, and a gate valve 43 to open and close the gate 42 are formed at the side wall of the chamber 11.

The substrate processing apparatus 100 further includes a heat dissipating member 20 installed on the lower surface of the susceptor 12. The heat dissipating member 20 makes thermal contact with the lower surface of the susceptor 12, and dissipates the heat of the susceptor 12 to the outside due to the thermal contact. Here, the thermal contact includes direct contact and indirect contact through a medium, and heat is transmitted through these direct contact and indirect contact. In order to effectively dissipate heat, the heat dissipating member 20 may be made of a material having a high heat transfer coefficient, which is one selected from the group consisting of ceramic, AlN, Ni, and Inconel.

Conventionally, in the susceptor 12, an amount of dissipated heat at the edge portion of the susceptor 12 is large, and thus the temperature at the edge portion of the susceptor 12 is relatively lowered. Further, an amount of radiated heat, i.e., heat, which is reflected by the shower head 13 being opposite to the susceptor 12 and is incident upon the wafer, at the central portion of the susceptor 12 is relatively large. As a result, the temperature at the central portion of the wafer is substantially raised, and it is difficult to obtain a uniform temperature distribution on the wafer.

Further, the central portion of the susceptor 12 located close to the supporting member 13 supporting the susceptor 12 is cooled by the supporting member 13, and thus the temperature at the central portion of the susceptor 12 is greatly lowered compared with the temperatures at other portions of the susceptor 12 and causes non-uniformity of the temperature distribution on the wafer.

In consideration of the above factors, the susceptor 12 is divided into three regions, as shown in FIG. 1. That is, the susceptor 12 is divided into first, second, and third regions A, B, and C in the direction from the center of the susceptor 12 to the edge of the susceptor 12. The first, second, and third regions A, B, and C, which will be described hereinafter, are exemplary, and may be enlarged and reduced according to external conditions including the heaters 15a and 15b (for example, the size of the wafer (W), process conditions, etc.).

The first region A, as described above, is a region, which is cooled by the supporting member 13, and thus represents a lower temperature distribution than that of the neighboring second region B. The third region C, as described above, is a region, which dissipates the largest amount of heat, and thus represents a lower temperature distribution than that of the neighboring second region B. Therefore, the second region B represents a higher temperature distribution than those of the first and third regions A and C.

The heat dissipating member 20 is disposed at an area corresponding to the second region B, and cools the second region B, thus securing temperature uniformity between the second region B and the first and third regions A and C. Differing from this embodiment, those skilled in the art will appreciate that various modifications of the size and shape of the heat dissipating member 20 are possible to secure temperature uniformity between the second region B and the first and third regions A and C. Hereinafter, the heat dissipating member 20 will be described in more detail with reference to FIGS. 2 and 3.

Figure 2:
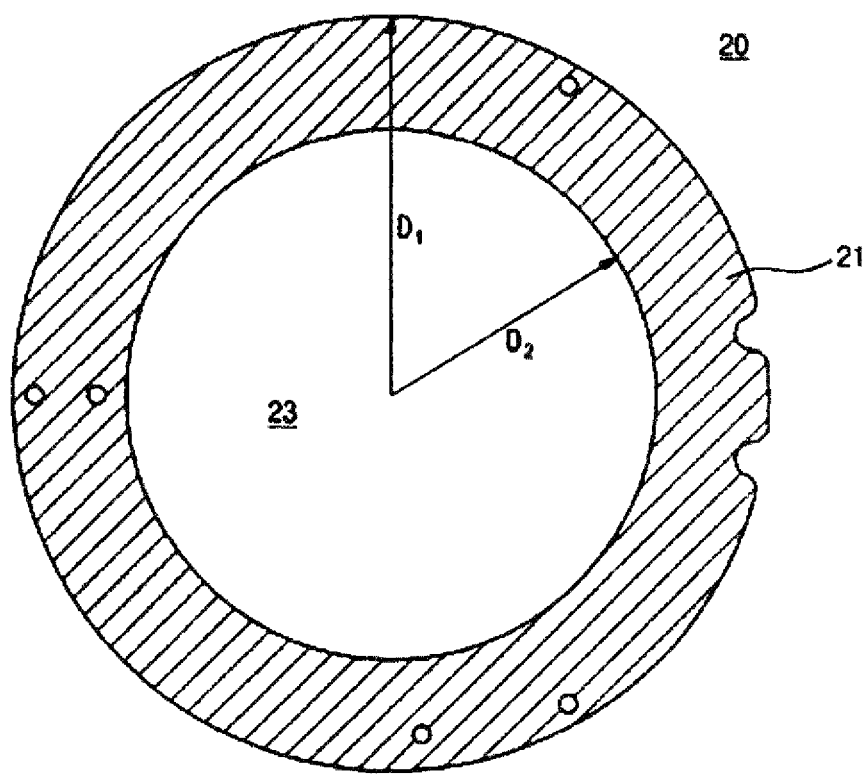
FIGS. 2 and 3 are views illustrating a heat dissipating member of FIG. 1.
Figure 3:
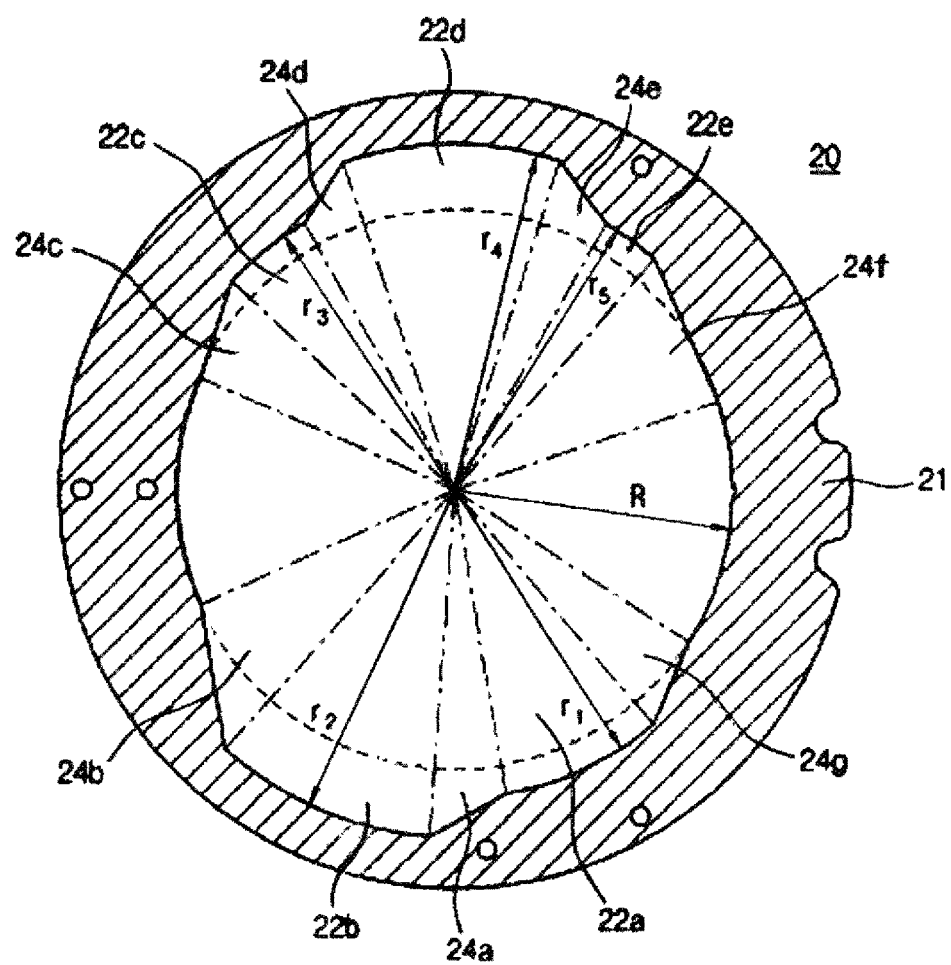

FIGS. 2 and 3 are views illustrating the heat dissipating member 20 of FIG. 1. FIG. 2 illustrates the heat dissipating member 20 before processing, and FIG. 3 illustrates the heat dissipating member 20 after processing. As shown in FIG. 2, the heat dissipating member 20 includes a ring-shaped contact surface 21 provided with an opening 23 formed through the center thereof, and the contact surface 21 makes thermal contact with the lower surface of the susceptor 12. The contact surface 21 has an outer diameter D1, which will be referred to as a first diameter, and the opening 23 has a diameter D2, which will be referred to as a second diameter.

Holes serving as moving paths of lift pins (not shown) to support a substrate on the susceptor 12 and holes to install the heat dissipating member onto the susceptor 12 are formed through the heat dissipating member 20.

A user processes the heat dissipating member 20 of FIG. 2 so as to have a shape, as shown in FIG. 3, and thus uniformly adjusts a temperature distribution on the susceptor 12. The heat dissipating member 20 of FIG. 3 is only exemplary, and the processed result of the heat dissipating member 20 may be varied according to the temperature distribution on the susceptor 12.

The user measures a temperature distribution on the susceptor 12 under the condition the heat dissipating member 20 is removed from the susceptor 12 (or, the user may perform a process under the condition that the wafer W is placed on the susceptor 12, and measure a temperature distribution on the wafer W during the process), and processes the opening 23 of the heat dissipating member 20 according to the measured temperature distribution. Here, the opening 23 is processed so as to have a size corresponding to a low-temperature region (a region having a lower temperature than those of other regions), and is disposed corresponding to the low-temperature region, when the heat dissipating member 20 is fixed to the susceptor 12.

As shown in FIG. 3, the processed heat dissipating member 20 includes a first opening part 22a having a first radius r1, a second opening part 22b having a second radius r2, a third opening part 22c having a third radius r3, a fourth opening part 22d having a fourth radius r4, and a fifth opening part 22e having a fifth radius r5. The first to fifth opening parts 22a to 22e have a fan shape, and are sequentially disposed in the clockwise direction.

That is, a temperature distribution on the susceptor 12 (or the wafer W), is measured and the radiuses, the sizes of the central angles, and the positions of the first to fifth opening parts 22a to 22e of the heat dissipating member 20 are determined according to the measured value. Through the above process, the first opening part 22a having the first radius r1 is formed, and the second opening part 22b having the second radius r2 is formed in the clockwise direction from the first opening part 22a. Further, a first intermediate opening part 24a having a triangular shape, which has two sides respectively having lengths being equal to the first radius r1 and the second radius r2 and one side connecting the two sides, is formed between the first opening part 22a and the second opening part 22b. The first intermediate opening part 24a is disposed between the first opening part 22a and the second opening part 22b, and interconnects the first and second opening parts 22a and 22b.

A second intermediate opening part 24b is formed in the clockwise direction from the second opening part 22b, and has a triangular shape, which has two sides respectively having lengths being equal to the second radius r2 and the radius R of the original opening 23 and one side connecting the two sides. The non-processed original opening 23 (having the radius R corresponding to a half of the second diameter D2) is located in the clockwise direction from the second opening part 22b.

By the above method, a third intermediate opening part 24c, the third opening part 22c, a fourth intermediate opening part 24d, the fourth opening part 22d, a fifth intermediate opening part 24e, the fifth opening part 22e, a sixth intermediate opening part 24f, and a seventh intermediate opening part 24g are sequentially disposed in the clockwise direction, and the non-processed original opening 23 (having the radius R corresponding to a half of the second diameter D2) is located between the sixth intermediate opening part 24f and the seventh intermediate opening part 24g.

As shown in FIG. 1, the heat dissipating member 20, which is processed through the above process, is installed to make thermal contact with the lower surface of the susceptor 12, particularly with the high-temperature region (the region having a higher temperature than those of other regions) of the susceptor 12, through the contact surface 21, and cools the high-temperature region of the susceptor 12 by dissipating heat. Here, the heat dissipating member 20 includes the first to fifth opening parts 22a to 22e and the first to seventh intermediate opening parts 24a to 24g, which correspond to the low-temperature region (the region having a lower temperature than those of other regions) of the susceptor 12. Therefore, the heat dissipating member 20 prevents the low-temperature region from being cooled through the contact surface 21. The high-temperature region of the susceptor 12 is cooled through the above process, and the susceptor 12 (particularly, the second region B) has a uniform temperature distribution.

Figure 4:
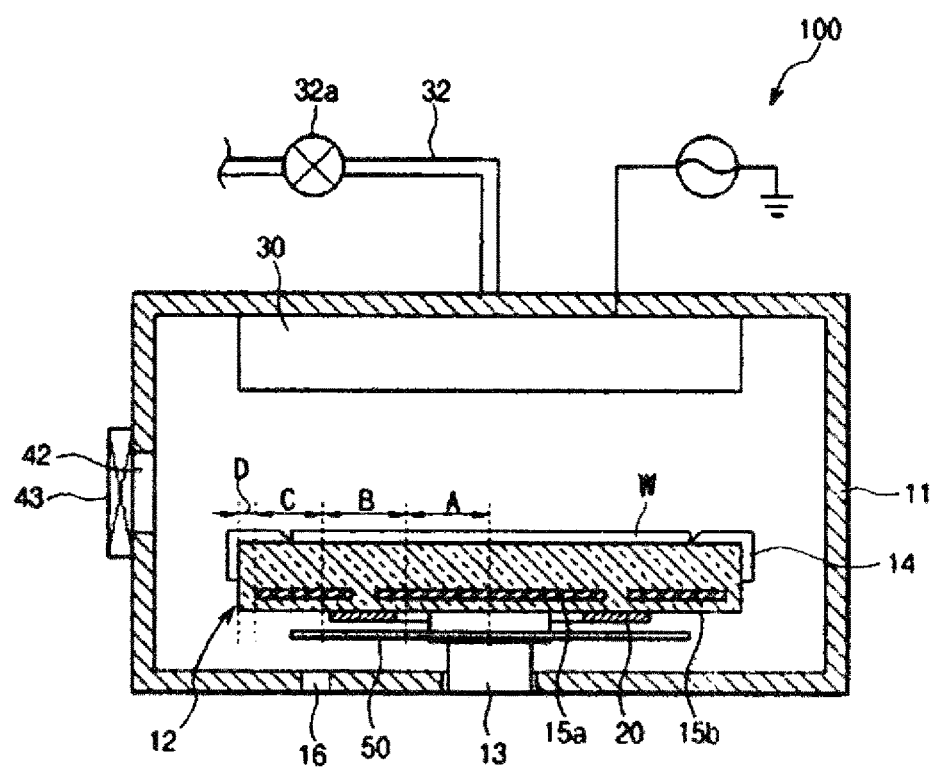
FIG. 4 is a view schematically illustrating a substrate processing apparatus in accordance with another embodiment of the present invention.

FIG. 4 is a view schematically illustrating a substrate processing apparatus in accordance with another embodiment of the present invention. Some parts in this embodiment, which are substantially the same as those in the former embodiment, will be denoted by the same reference numerals even though they are depicted in different drawings, and a detailed description thereof will be omitted because it is considered to be unnecessary. Further, only parts in this embodiment, which are substantially different from those in the former embodiment, will be described.

As shown in FIG. 4, a susceptor 12 is divided into four regions. That is, a fourth region D is located at the outside of a third region C, and has a higher temperature distribution than that of the neighboring the third region C.

The substrate processing apparatus 100 further includes a reflecting member 50 disposed below a heat dissipating member 20 approximately in parallel with the heat dissipating member 20. The reflecting member 50 reflects heat, which is emitted from the susceptor 12 to the reflecting member 50, toward the susceptor 12, and the susceptor 12 is reheated by the reflected heat. Particularly, the reflected heat heats the third region C having a lower temperature than that of the fourth region D, thus causing the susceptor 12 to obtain a uniform temperature distribution. In order to effectively reflect heat, the reflecting member 50 may be made of a material having a high reflectivity, which is one selected from the group consisting of ceramic, AlN, Ni, and Inconel.

Figure 5:
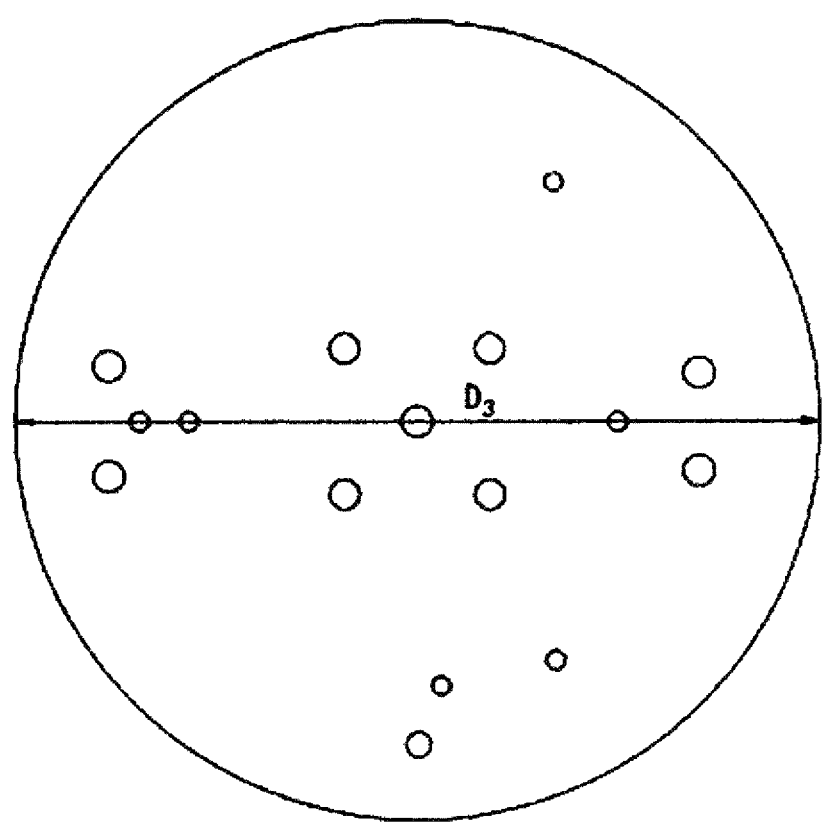
FIGS. 5 and 6 are views illustrating a reflecting member of FIG. 4.
Figure 6:
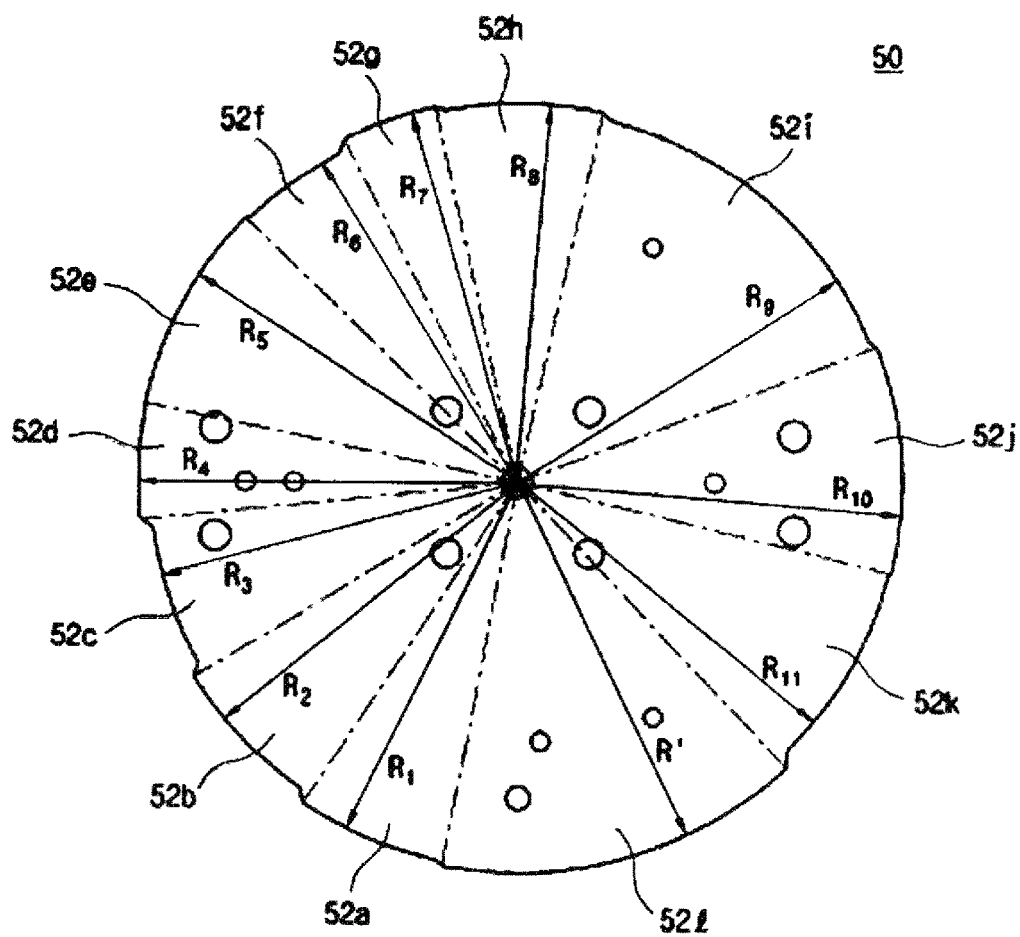

Hereinafter, the reflecting member 50 will be described in more detail with reference to FIGS. 5 and 6. FIGS. 5 and 6 are views illustrating the reflecting member 50 of FIG. 4. FIG. 5 illustrates the reflecting member 50 before processing, and FIG. 6 illustrates the reflecting member 50 after processing. As shown in FIG. 5, the reflecting member 50 has a disk shape having a third diameter D3. A plurality of holes to install the reflecting member 50 onto a supporting member 13 is formed through the reflecting member 50.

A user processes the reflecting member 50 of FIG. 5 so as to have a shape, as shown in FIG. 6, and thus uniformly adjusts a temperature distribution on the susceptor 12. The reflecting member 50 of FIG. 6 is only exemplary, and the processed result of the reflecting member 50 may be varied according to the temperature distribution on the susceptor 12.

The user measures a temperature distribution on the susceptor 12 under the condition the reflecting member 50 is removed from the susceptor 12 (or, the user may perform a process under the condition that the wafer W is placed on the susceptor 12, and measure a temperature distribution on the wafer W during the process), and processes the edge of the reflecting member 50, as shown in FIG. 6, according to the measured temperature distribution. That is, as described above, in case that the fourth region D is a high-temperature region and the third region C is a low-temperature region, the heat emitted from the susceptor 12 is supplied to the third region C using the reflecting member 50, and heats the third region C. Here, in order to prevent the heat reflected by the reflecting member 50 from being supplied to the fourth region D, the edge of the reflecting S member 50 is processed.

As shown in FIG. 6, the processed reflecting member 50 includes first to twelfth reflecting member parts 52a to 52l having a fan shape, which are sequentially disposed in the clockwise direction.

The first to eleventh reflecting member parts 51a to 52k respectively have first to eleventh radiuses R1 to R11, and the twelfth reflecting member part 52l has an original radius R corresponding to a half of the third diameter D3. That is, as shown in FIG. 6, the edge of the reflecting member 50 is processed according to the measured temperature distribution, and the first to twelfth reflecting member parts 52a to 52l are formed by processing. The radiuses and the central angles of the first to twelfth reflecting member parts 52a to 52l of FIG. 6 are only exemplary, and may be modified according to the measured temperature distribution.

The above reflecting member 50 supplies reflected heat to the third region C and prevents the supply of the reflected heat to the fourth region D, thus uniformly adjusting the temperature distribution on the susceptor 12.

Figure 7:
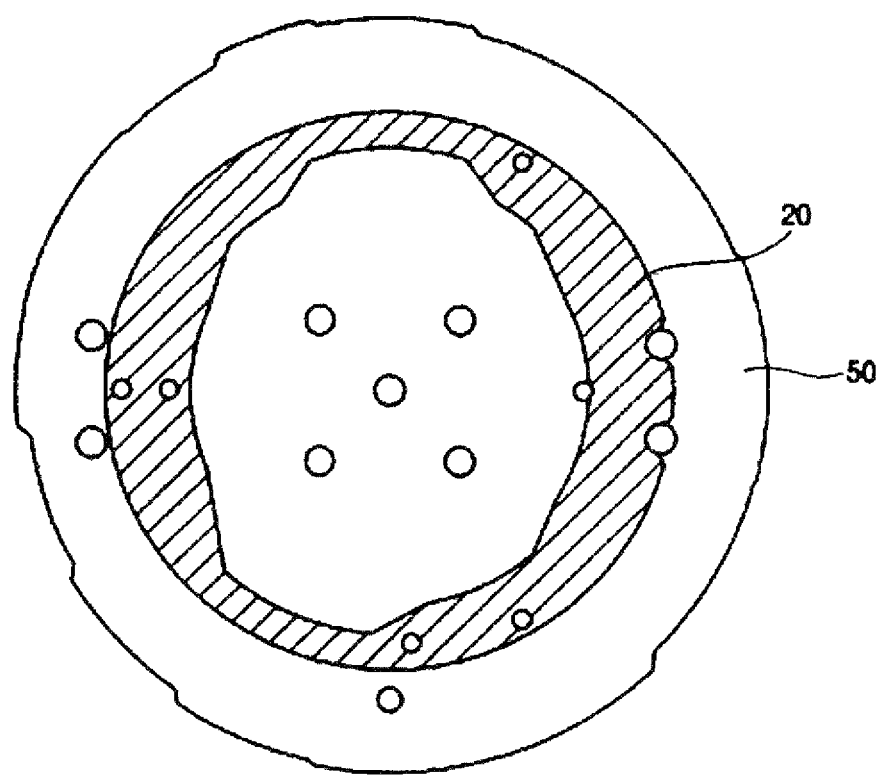
FIG. 7 is a view illustrating a heat dissipating member and the reflecting member of FIG. 4.

FIG. 7 is a view illustrating the heat dissipating member 20 and the reflecting member 50 of FIG. 4. As shown in FIG. 4, the heat dissipating member 20 and the reflecting member 50 may be used together, and thus more uniformly adjust the temperature distribution on the front surface of the susceptor 12. For example, temperature uniformity between the first region A and the second region B is secured by the heat dissipating member 20, and temperature uniformity between the third region C and the fourth region D is secured by the reflecting member 50. However, this embodiment is only exemplary, and the functions of the heat dissipating member 20 and the reflecting member 50 may be exchanged.

In accordance with the present invention, a temperature distribution on the wafer is uniformly adjusted. Further, a temperature distribution on the susceptor is uniformly adjusted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a substrate supporting unit provided with a susceptor, on which a substrate is placed, comprising installing a heat dissipating member at one side of the susceptor, including a first temperature region and a second temperature region having a higher temperature than that of the first temperature region, such that the heat dissipating member is in thermal contact with the second temperature region so as to emit heat of the second temperature region, and forming an opening corresponding to the first temperature region through the heat dissipating member to prevent thermal contact between the first temperature region and the heat dissipating member, wherein:
the heat dissipating member is formed in a ring shape, in which the opening corresponding to the first temperature region is surrounded with a contact surface corresponding to the second temperature region, and
the formation of the opening includes
forming a first opening part in a fan shape having a first radius, and
forming a second opening part in a fan shape having a second radius being different from the first radius.

2. The method according to claim 1, further comprising disposing a reflecting member approximately in parallel with one surface of the susceptor to reflect heat emitted from the susceptor toward the susceptor.

3. The method according to claim 2, wherein:
the susceptor further includes a third temperature region having a lower temperature than that of the second temperature region and a fourth temperature region having a higher temperature than that of the third temperature region; and
the disposition of the reflecting member includes:
processing the reflecting member formed in a disk shape having a predetermined radius to form a first reflecting member part in a fan shape having a first radius being smaller than the predetermined radius; and
processing the reflecting member to form a second reflecting member part in a fan shape having a second radius being smaller than the predetermined radius and being different from the first radius.

* * * * *